United States Patent
Kang et al.

(10) Patent No.: US 8,194,440 B2
(45) Date of Patent: Jun. 5, 2012

(54) PHASE CHANGE MEMORY DEVICE HAVING MULTIPLE RESET SIGNALS AND OPERATING METHOD THEREOF

(75) Inventors: Hee Bok Kang, Chungcheongbuk-do (KR); Suk Kyoung Hong, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 1035 days.

(21) Appl. No.: 12/133,725

(22) Filed: Jun. 5, 2008

(65) Prior Publication Data

US 2009/0040811 A1    Feb. 12, 2009

(30) Foreign Application Priority Data

Aug. 10, 2007 (KR) .................. 10-2007-0080664

(51) Int. Cl.
  *G11C 11/00* (2006.01)
(52) U.S. Cl. ........................... 365/163; 365/148
(58) Field of Classification Search ............ 365/46, 365/94, 100, 113, 129, 148, 163; 257/2–5, 257/296, E31.047, E27.006; 438/29, 95, 438/96, 166, 259, 365, 482, 486, 597; 977/754
See application file for complete search history.

(56) References Cited

U.S. PATENT DOCUMENTS

| | | | |
|---|---|---|---|
| 6,667,900 B2 * | 12/2003 | Lowrey et al. | 365/171 |
| 6,768,665 B2 * | 7/2004 | Parkinson et al. | 365/113 |
| 2002/0041947 A1 * | 4/2002 | Chin et al. | 428/64.4 |
| 2003/0067013 A1 | 4/2003 | Ichihara et al. | |
| 2003/0123284 A1 * | 7/2003 | Lowrey et al. | 365/175 |
| 2006/0072370 A1 * | 4/2006 | Kuh et al. | 365/232 |
| 2006/0151849 A1 * | 7/2006 | Czubatyj | 257/467 |
| 2007/0297221 A1 * | 12/2007 | Philipp et al. | 365/163 |
| 2008/0258129 A1 * | 10/2008 | Toda | 257/5 |

FOREIGN PATENT DOCUMENTS

| | | |
|---|---|---|
| KR | 1020050030294 A | 3/2005 |
| KR | 2005-0079030 A | 8/2005 |
| KR | 2006-0105359 A | 10/2006 |

* cited by examiner

*Primary Examiner* — Alexander Sofocleous
*Assistant Examiner* — Harry W Byrne
(74) *Attorney, Agent, or Firm* — Ladas & Parry LLP (57) ABSTRACT

A phase change memory device includes a cell array unit having a phase change resistance cell positioned at an intersection of a word line and a bit line. A write driving unit is configured to generate a single write voltage to the cell array unit when data to be written is a first data and is configured to generate a plurality of write voltages selectively when the data is a second data.

20 Claims, 14 Drawing Sheets

PHASE CHANGE MEMORY DEVICE HAVING MULTIPLE RESET SIGNALS AND OPERATING METHOD THEREOF

CROSS-REFERENCES TO RELATED APPLICATIONS

The present application is based upon and claims priority to Korean Patent Application No. 10-2007-80664 filed on Aug. 10, 2007, the entire contents of which are incorporated herein by reference.

BACKGROUND OF THE INVENTION

The present invention relates generally to a phase change memory device, and more particularly to a technology of verifying an operating condition corresponding to a characteristic of each phase change resistance cell included in a cell array in a write mode so as to write a reset data normally.

A nonvolatile memory has a data processing speed similar to that of a volatile Random Access Memory (RAM), however, unlike a volatile RAM, a nonvolatile memory conserves data even when no power is supplied to the memory, that is, after the power is turned off.

Figure 1A:
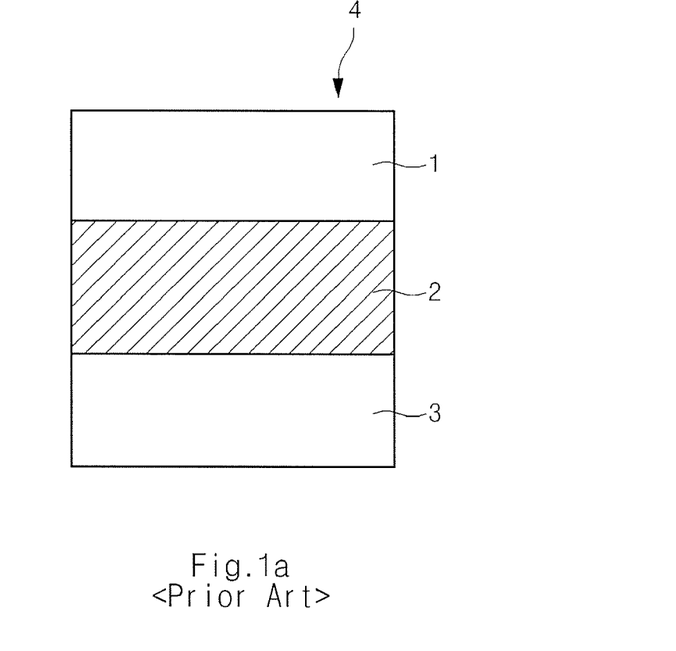
FIGS. 1a and 1b are diagrams showing a conventional phase change resistor.
Figure 1B:
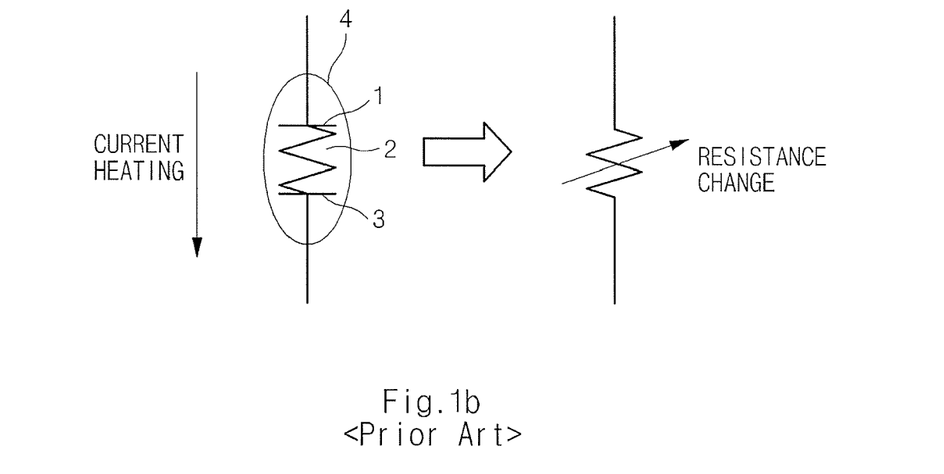

FIGS. 1a and 1b are diagrams showing a conventional phase change resistor (PCR) 4.

The PCR 4 comprises a phase change material (PCM) 2 inserted between an upper electrode 1 and a lower electrode 3. When a voltage and a current are applied to the PCR 4, a high temperature is generated in the PCM 2 such that an electric conductive state of the PCR 4 is changed depending on resistance.

The PCM comprises AgLnSbTe. The PCM 2 may also comprise chalcogenide having chalcogen elements (S, Se, Te) as a main ingredient, specifically a germanium antimonic tellurium (Ge2Sb2Te5) consisting of Ge—Sb—Te.

Figure 2A:
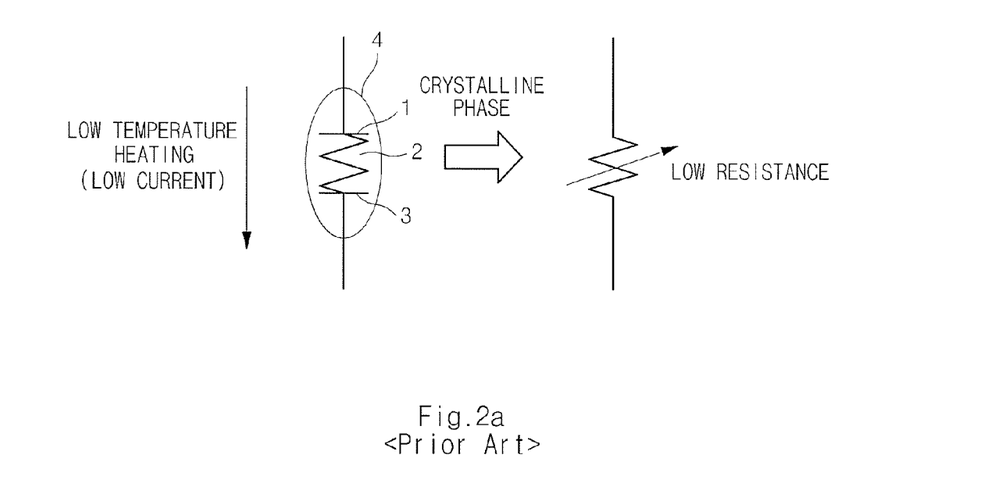
FIGS. 2a and 2b are diagrams showing the operation principle of the conventional phase change resistor.
Figure 2B:
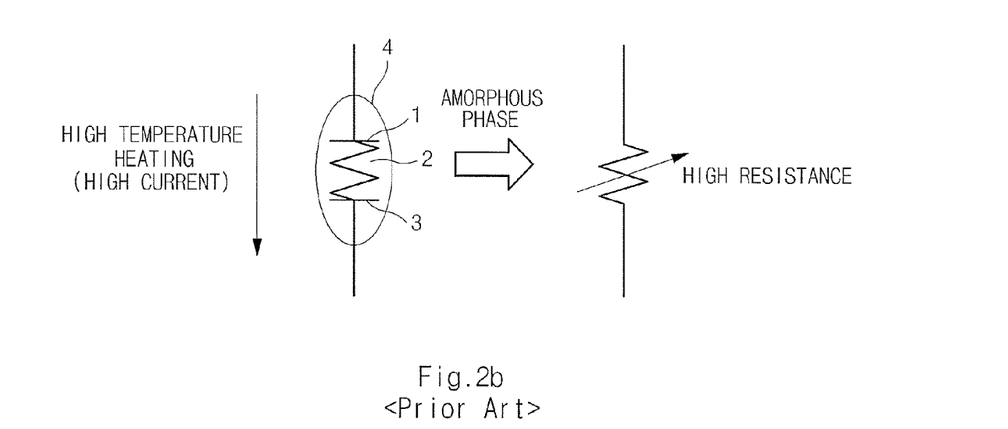

FIGS. 2a and 2b are diagrams showing the principle operation of the conventional PCR 4.

As shown in FIG. 2a, the PCM 2 can be crystallized when a low current, i.e., a current of less than a threshold value, flows through the PCR 4. As a result, the PCM 2 becomes a crystallized low resistance material.

As shown in FIG. 2b, the PCM 2 can be amorphized when a high current, i.e., a current higher than a threshold value, flows through the PCR 4. That is, the temperature of the PCM 3 is increased higher that its melting point when a high current flows through the PCR 4. As a result, the PCM 2 becomes an amorphous high resistance material.

In this way, the PCR 4 is configured to store nonvolatile data corresponding to the two resistance states. Data "1" refers to the PCR 4 having a low resistance state, and data "0" refers to the PCR 4 having a high resistance state so that the logic states of the two data can be stored.

Figure 3:
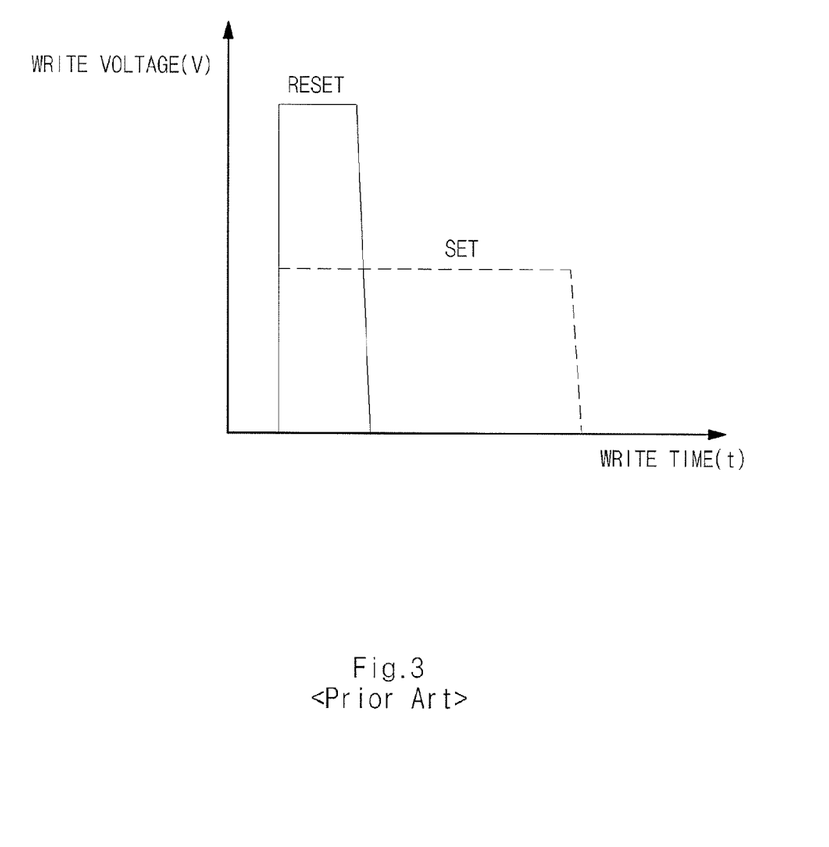
FIG. 3 is a diagram showing the write operation of a conventional phase change resistant cell.

FIG. 3 is a diagram showing a write operation of a conventional phase change resistant cell.

Heat is generated when a current flows through the upper electrode 1 and the lower electrode 3 of the PCR 4 for a given time. As a result, a state of the PCM 2 is changed to be either crystalline or amorphous depending on temperature given to the upper electrode 1 and the lower electrode 3.

When a low current flows for a given time, the PCM 2 becomes crystalline and the PCR 4, having a low resistance, is at a set state. On the other hand, when a high current flows for a given time, the PCM becomes amorphous and the PCR 4, having a high resistance, is at a reset state. The difference between two phases corresponds to a change in electric resistance.

As shown in FIG. 3, a low voltage is applied to the PCR 4 for a period of time in order to write the set state in a write mode. On the other hand, a high voltage is applied to the PCR 4 for a shorter period of time in order to write the reset state in the write mode.

Figure 4:
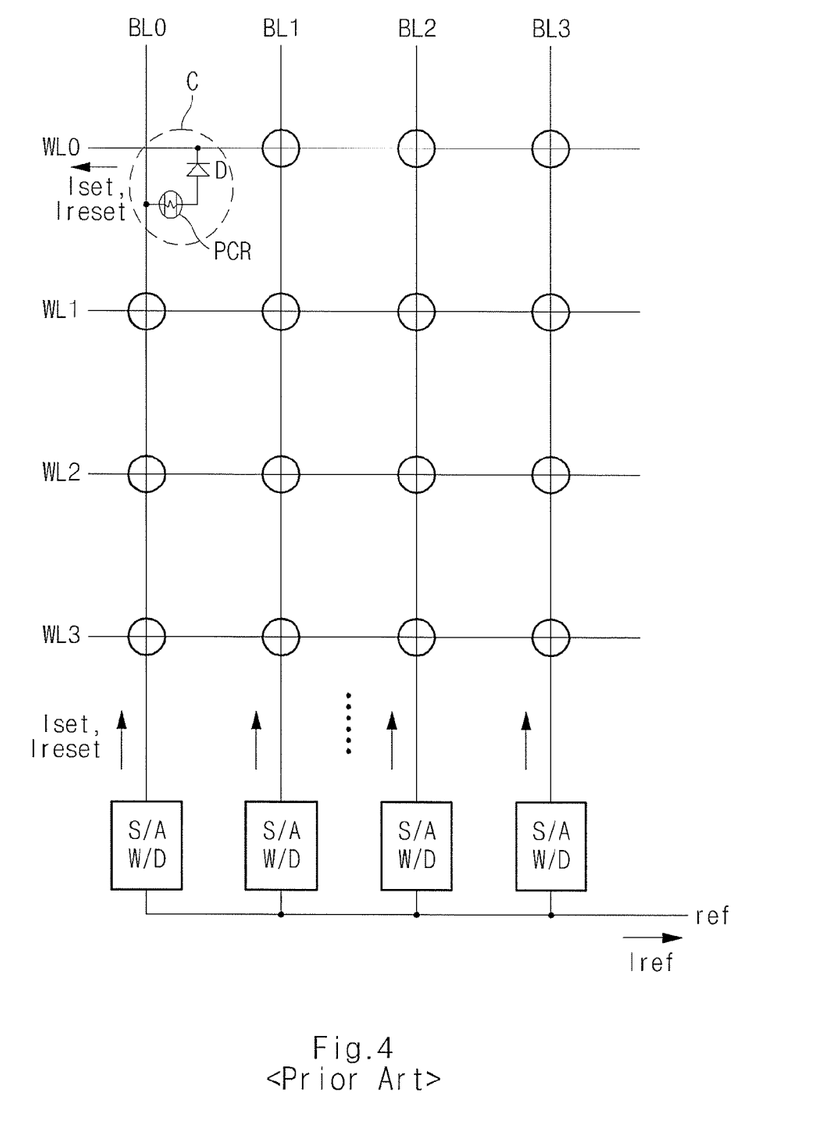
FIG. 4 is a diagram showing the cell array of a conventional phase change memory device.

FIG. 4 is a diagram showing a cell array of a conventional phase change memory device.

The conventional cell array as shown in FIG. 4 includes a plurality of bit lines BL0~BL3 arranged in a column direction and a plurality of word lines WL0~WL3 arranged in a row direction. The cell array also includes unit change resistance cells C positioned at intersections of the bit lines BL0~BL3 and the word lines WL0~WL3. The unit phase change resistance cell C includes a phase change resistor PCR and a PN diode D.

The phase change resistor PCR has a first terminal connected to the bit line BL and a second terminal connected to a P-type region of the PN diode D. The P-type region of the PN diode D is connected to the second terminal of the phase change resistor PCR and the N-type region of the PN diode D is connected to the word line WL.

In the cell array of the conventional phase change memory device, the phase of the phase change resistor PCR is varied depending on a set current Iset and a reset current Ireset flowing through each bit line BL to a write data.

A sense amplifier S/A senses cell data received through the bit line BL and compares the cell data with a reference voltage ref to distinguish set data from reset data. A reference current Iref flows in a reference voltage ref receiving terminal. A write driving unit W/D supplies a driving voltage, which corresponds to a data state, to the bit line BL when data is written in the unit phase change resistance cell C.

Figure 5:
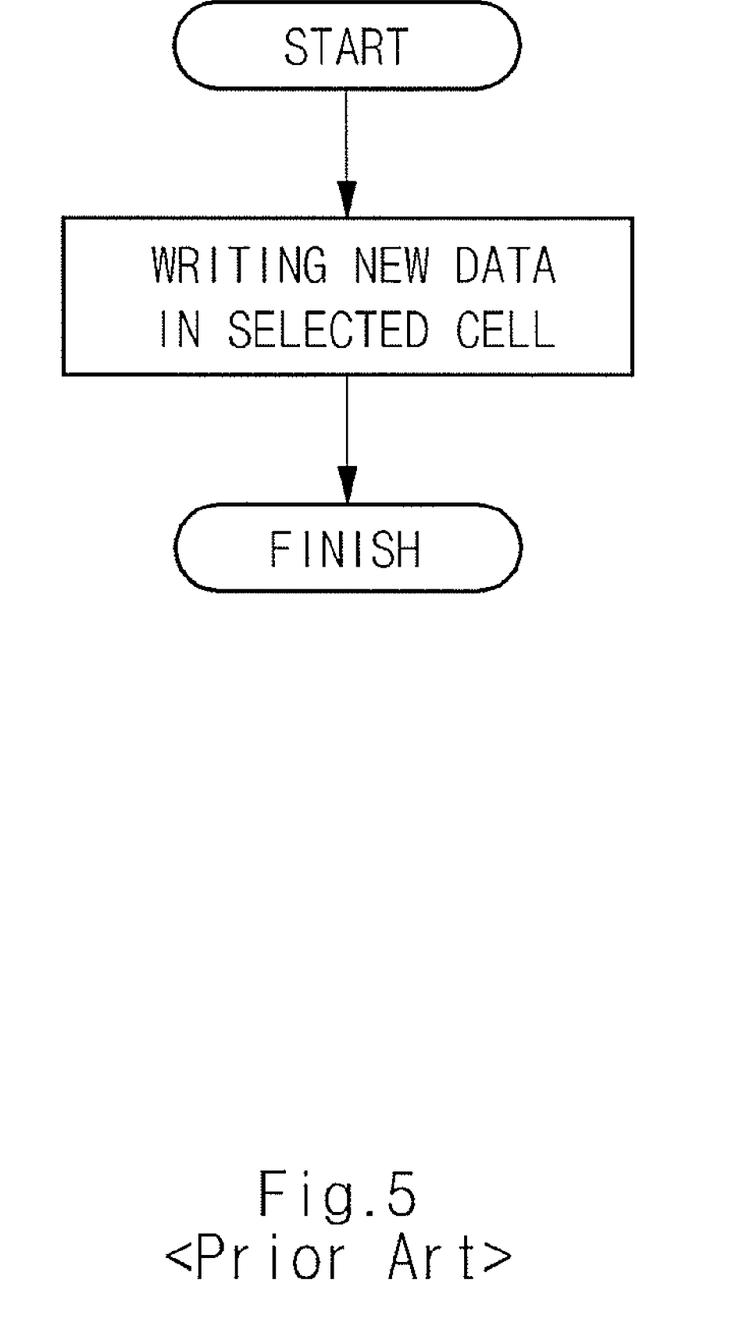
FIG. 5 is a flow chart showing the write cycle operation of a conventional phase change memory device.

FIG. 5 is a flow chart showing a write cycle operation of a conventional phase change memory device.

When the write cycle begins, a new write operation begins regardless of the data stored in the unit phase change resistance cell C. For example, even when the data stored in the phase change resistance cell C is identical with the data to be written, a new write operation is performed. As a result, the number of write operations of the reset data and a set data is increased thereby increasing power consumption, and the cell is degraded to deteriorate a write characteristic.

Figure 6:
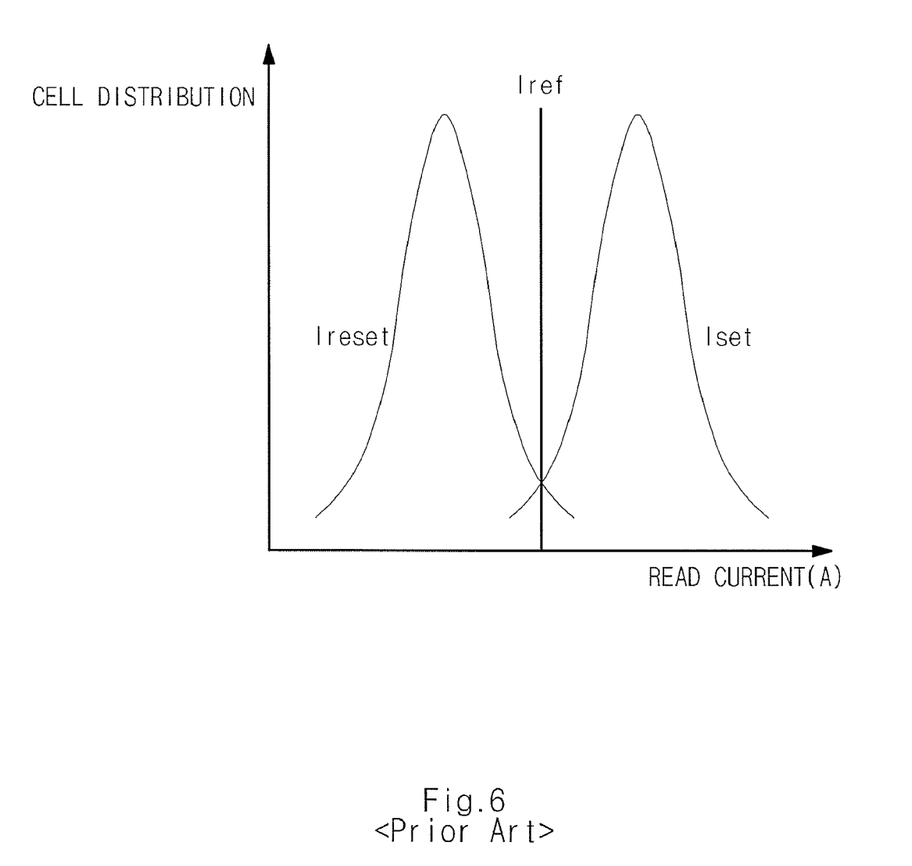
FIG. 6 is a diagram showing a read current relation of a conventional phase change memory device.

FIG. 6 is a diagram showing the read current relationship of a conventional phase change memory device.

Each phase change resistance cell C included in a cell array has a different read current distribution depending on process, device and design conditions. That is, the distribution of the set current Iset, which corresponds to the set data, and the reset current Ireset, which corresponds to the reset data, becomes broader based on a read current.

As a result, the read currents of some cells may be overlap the read currents of other cells based on the reference current Iref. When the reset current Ireset is distinguished from the set current Iset by the reference current Iref, a data fail is generated in the unit phase change resistance cell C.

SUMMARY OF THE INVENTION

The phase change memory device according to embodiments of the present invention determines whether data stored in a phase change resistance cell is identical with new data to be written in a write mode of a phase change memory device to perform writing operation, thereby reducing the number of unnecessary write operations.

The phase change memory device according to embodiments of the present invention writes data normally in all unit phase change resistance cells under an operating condition suitable for a characteristic of each unit phase change resistance cell of a cell array in a write mode of a phase change memory device.

The phase change memory device according to embodiments of the present invention drives a stable reset write state in a phase change memory device to improve reliability of cells and a margin of read sensing currents.

The phase change memory device according to embodiments of the present invention changes a write condition when an initial cell write characteristic is different in a phase change memory device to have a normal reset write condition.

According to an embodiment of the present invention, a phase change memory device comprises: a cell array unit including a phase change resistance cell positioned at an intersection of a word line and a bit line; and a write driving unit configured to generate a single write voltage to the cell array unit when data to be written is first data and generate a plurality of write voltages selectively when the data is second data.

According to an embodiment of the present invention, an operating method of a phase change memory device, which comprises a phase change resistance cell configured to sense crystallization changed depending on currents so as to store data corresponding to resistance change, comprises: reading data of the phase change resistance cell selected in a write mode; comparing data to be written with data read in the phase change resistance cell to judge whether the data are the same or not; judging whether the data to be written is first data when the read data is different from the data to be written; and changing a write operating condition when the data to be written is first data to write and verify the first data in the phase change resistance cell.

DETAILED DESCRIPTION

Figure 7:
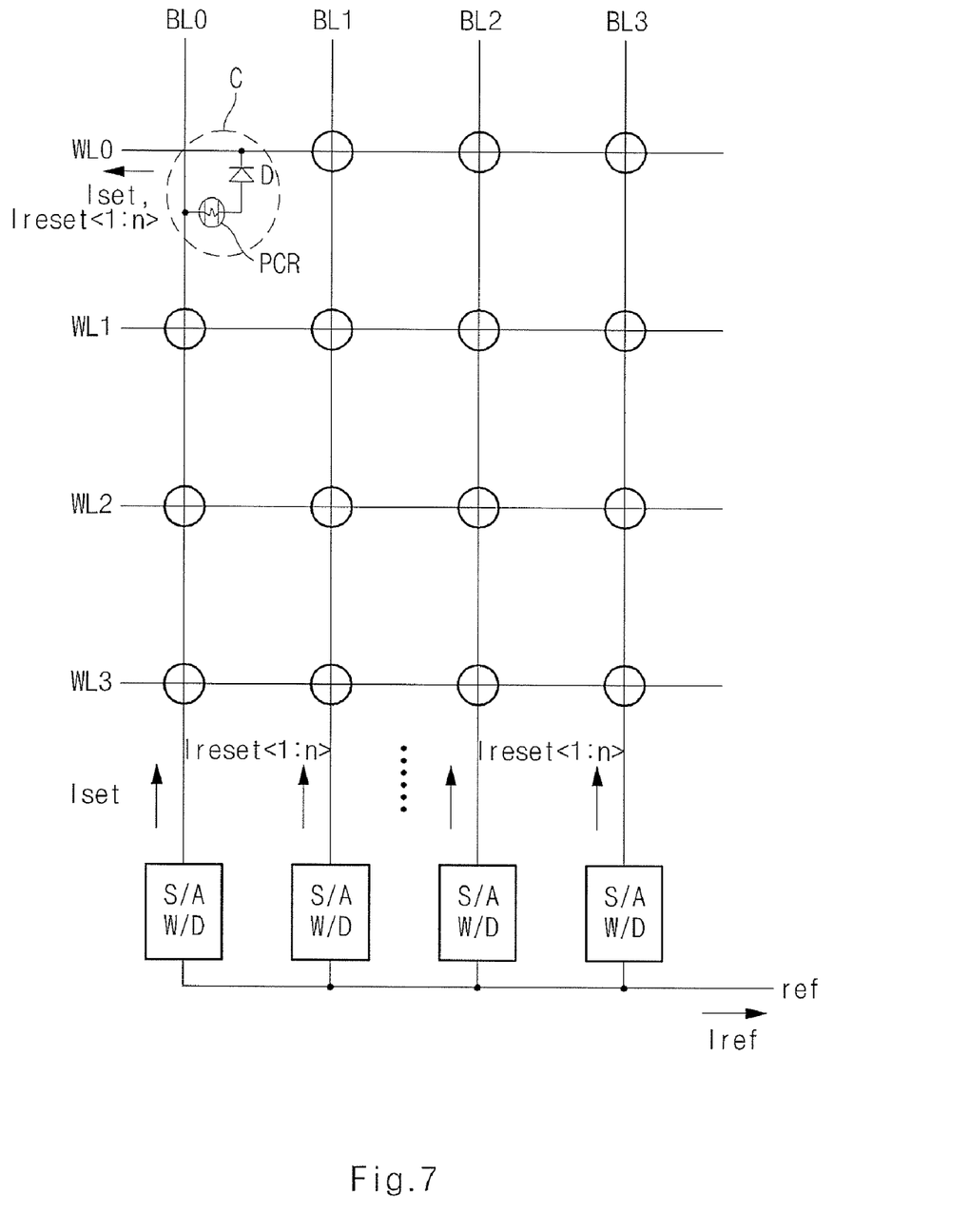
FIG. 7 is a diagram showing a cell array of a phase change memory device according to an embodiment of the present invention.

FIG. 7 is a diagram showing a cell array of a phase change memory device according to an embodiment of the present invention.

The cell array includes a plurality of bit lines BL0~BL3 arranged in a column direction and a plurality of word lines WL0~WL3 arranged in a row direction. The cell array includes a plurality of unit cells C arranged at intersections of the bit lines BL0~BL3 and the word lines WL0~WL3. The unit cell C includes a phase change resistor PCR and a PN diode D.

The phase change resistor PCR has a first terminal connected to the bit line BL and a second terminal connected to a P-type region of the PN diode D. The P-type region of the PN diode D has a is connected to the second terminal of the phase change resistor PCR and the N-type region of the PN diode D is connected to the word line WL. A phase of the phase change resistor PCR is varied to a write data according to a set current Iset and a plurality of reset currents Ireset<1:n> flowing in each bit line BL.

The sense amplifier S/A senses cell data received through the bit line BL, and compares the cell data with a reference voltage ref to distinguish et data from reset data. A reference current Iref flows in a reference voltage ref receiving terminal.

When data is written in a phase change resistance cell C, the write driving unit W/D supplies a write voltage, which corresponds to a data state, to the bit line BL. Each write driving unit W/D is individually operated. A single write voltage Vset is outputted when writing a set data, and a plurality of write voltages Vreset<1:n> are selectively outputted when writing a reset data.

Figure 8:
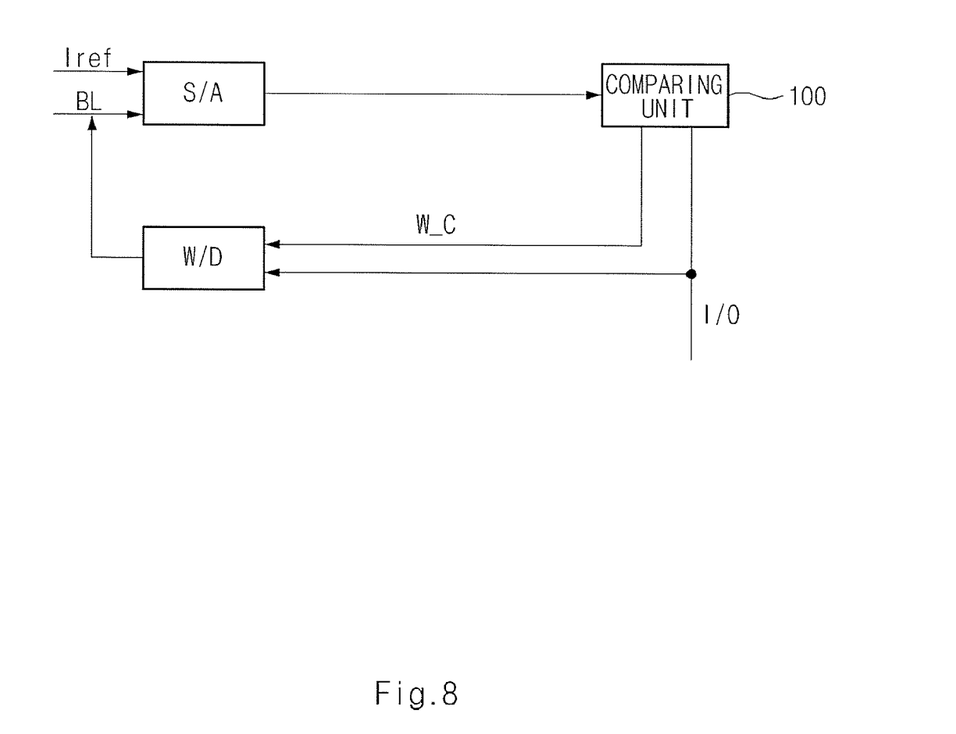
FIG. 8 is a diagram showing a sense amplifier and a write driving unit of FIG. 7.

FIG. 8 is a diagram showing the sense amplifier S/A and the write driving unit W/D of FIG. 7.

The sense amplifier S/A compares cell data received through the bit line BL with the reference current Iref to amplify the cell data. The write driving unit W/D supplies a driving voltage when data is written in the cell corresponding to a write data to the bit line BL in response to a write control signal W_C.

The comparing unit 100 compares cell read data outputted from the sense amplifier S/A with a write data received from an input/output line I/O to output the write control signal W_C received by the write driving unit W/D.

The comparing unit 100 inactivates the write control signal W_C when the cell read data outputted from the sense amplifier S/A is equal to the write data received from the input/output lines I/O. The operation of the write driving unit W/D is stopped when the write control signal W_C is inactivated.

The comparing unit 100 activates the write control signal W_C when the cell read data outputted from the sense amplifier S/A is not equal to the write data received from the input/output lines I/O. As such, the write driving unit W/D is operated to write new data through the bit line BL when the write control signal W_C is activated.

Figure 9:
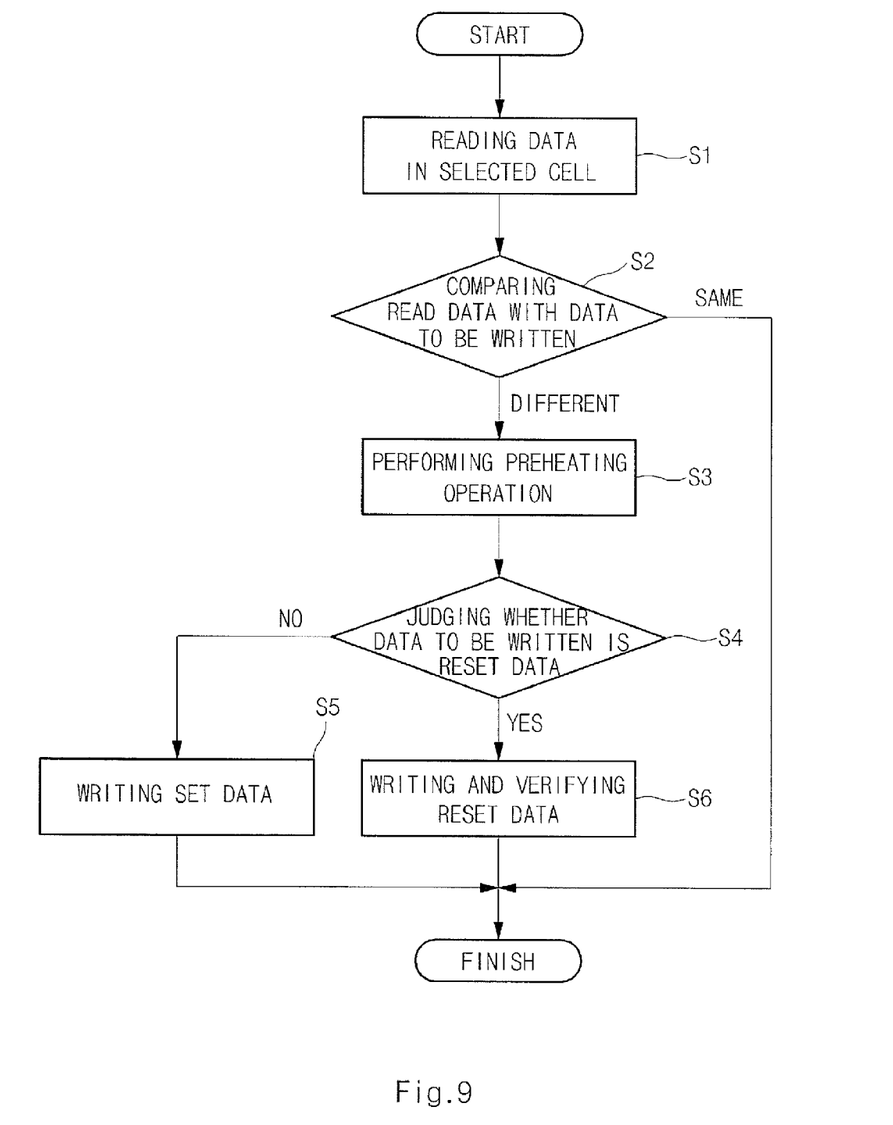
FIG. 9 is a flow chart showing a write cycle operation of a phase change memory device according to an embodiment of the present invention.

FIG. 9 is a flow chart showing a write cycle operation of a phase change memory device according to an embodiment of the present invention.

When a write cycle begins, data of the unit phase change resistance cell C selected through the sense amplifier S/A is read to determine whether the data stored in the selected unit phase change resistance cell C is a set data or a reset data (step S1).

The comparing unit 100 compares cell data read in the sense amplifier S/A with write data received from the input/output lines I/O and outputs the write control signal W_C accordingly (step S2).

The comparing unit 100 inactivates the write control signal W_C when the data read in the sense amplifier S/A is equal to the write data received from the input/output lines I/O. At this time, the operation of the write driving unit W/D is stopped and new data is not written in the unit phase change resistance cell C.

When the data outputted from the sense amplifier S/A is equal to the write data received from the input/output lines I/O, the data to be written is already stored in a cell and therefore a new write operation is not performed. As a result, according to an embodiment of the present invention the number of reset and set write operations can be reduced.

The comparing unit 100 activates the write control signal W_C when the data outputted from the sense amplifier S/A is not equal to the write data received from the input/output lines I/O. When the write control signal W_C is activated, the write driving unit W/D supplies a write voltage corresponding to the data written in the bit line BL.

When the write control signal W_C is activated, a peak current is applied to the selected unit phase change resistance cell C preheating the phase change resistor PCR (step S3).

Figure 10:
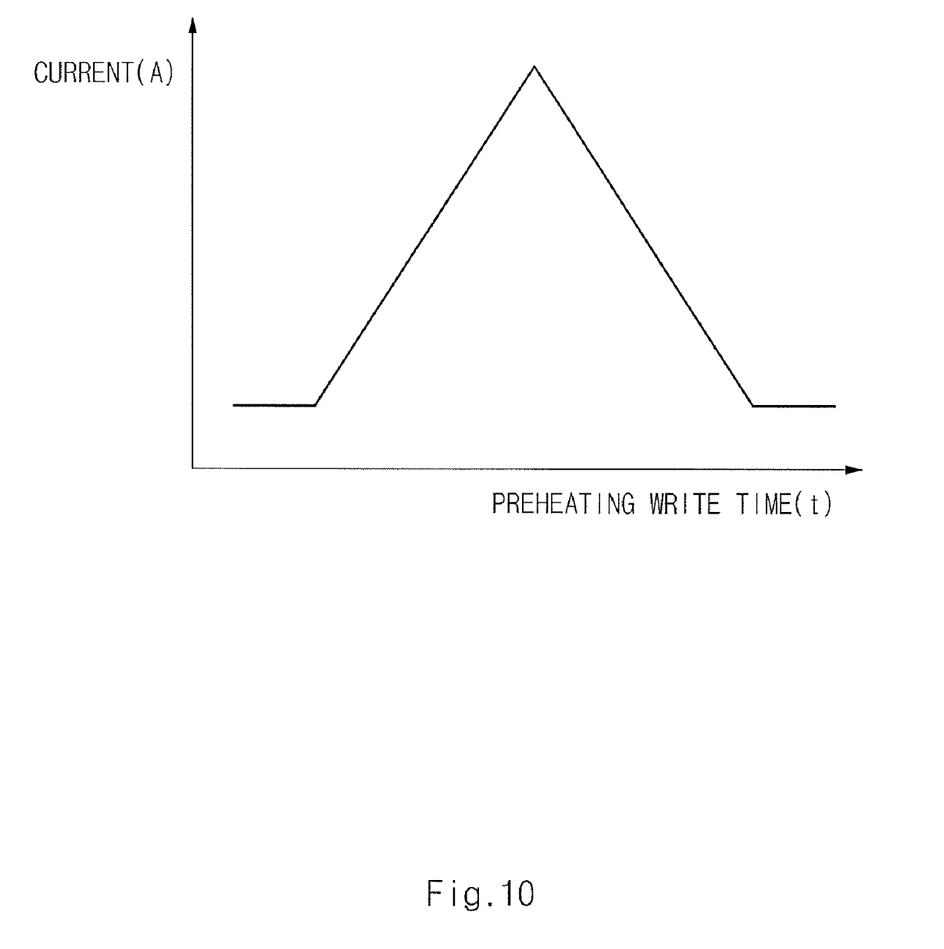
FIG. 10 is a diagram showing a preheating operation according to an embodiment of the present invention.

As shown in FIG. 10, the unit phase change resistance cell C receives a current having a triangle pulse shape for a given time during the preheating operation.

The structured material of the phase change resistor PCR is annealed by the preheating operation such that the material is aligned to prevent binding of the structured material of the phase change resistor PCR, thereby stabilizing the device.

A read/write operation starts when the phase change resistor PCR is warmed up, so that the temperature condition may be constantly maintained during a read/write cycle.

When performing an individual write operation it must be determined whether the data to be written is a set data or a write data (step S4).

When the data to be written is a reset data, the write driving unit W/D writes the new reset data in the phase change resistance cell C completing the write cycle (step S5).

When the data to be written is a set data, the write driving unit W/D writes the new set data in the phase change resistance cell C under a first operating condition described below (step S6).

That is, a write operating condition is changed one or more times with the reset reference current Iref so as to repeat a verifying operation until a new reset data is normally written. The writing and verifying operation of the new reset data include repeating writing, reading, and verifying a plurality of reset states until the read cell data is equal to the write data.

Figure 11:
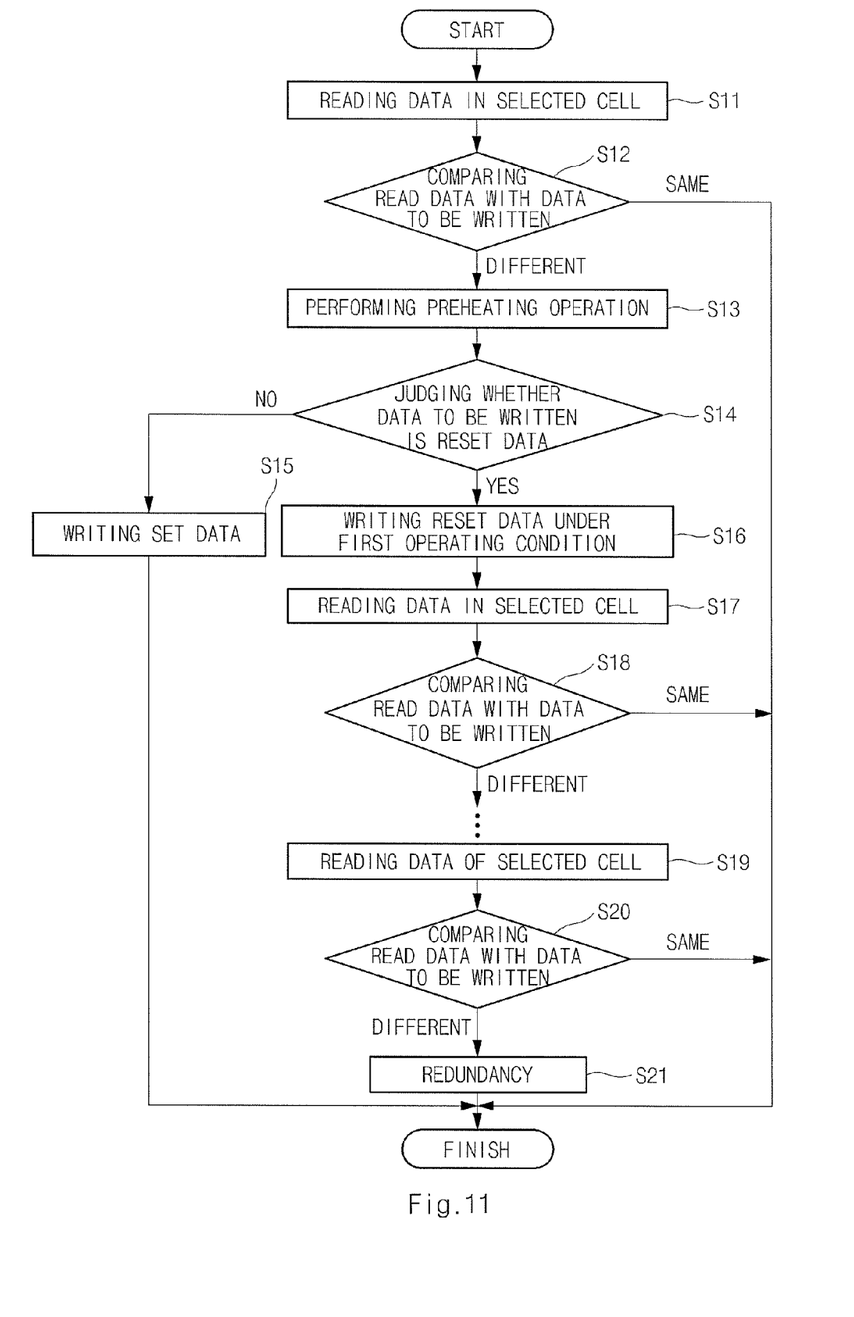
FIG. 11 is a flow chart showing a write cycle operation of a phase change memory device according to an embodiment of the present invention.

FIG. 11 is a detailed flow chart showing a write cycle operation of a phase change memory device according to an embodiment of the present invention.

When a write cycle starts, it is determined whether data stored in the unit phase change resistance cell C is set data or reset data. As a result, the data of the unit phase change resistance cell C that is selected first through the sense amplifier S/A is read (step S11).

The comparing unit 100 compares cell data read in the sense amplifier S/A with a write data received from the input/output lines is I/O and outputs the write control signal W_C accordingly (step S12).

The comparing unit 100 inactivates the write control signal W_C when the data read in the sense amplifier S/A is equal to the write data received from the input/output lines I/O. At this time, the operation of the write driving unit W/D is stopped and new data is not written in the unit phase change resistance cell C.

The comparing unit 100 activates the write control signal W_C when the data outputted from the sense amplifier S/A is not equal to the write data received from the input/output lines I/O.

When the write control signal W_C is activated, a peak current is applied to the selected unit phase change resistance cell C preheating the phase change resistor PCR (step S13).

When performing an individual write operation it must be determined whether the data to be written is a set data or a write data (step S14).

When the data to be written is a reset data, the write driving unit W/D writes a new reset data in the phase change resistance cell C completing the write cycle (step S15).

When the data to be written is a set data, the write driving unit W/D writes the new set data in the phase change resistance cell C under a first operating condition (step S16).

The sense amplifier S/A reads the first reset data stored in the phase change resistance cell C (step S17). The comparing unit 100 compares the data read in the sense amplifier S/A with the data received from the input/output line I/O (step S18).

When the data read in the sense amplifier S/A is equal to the set data received from the input/output line I/O, the comparing unit 100 inactivates the write control signal W_C finishing the write cycle.

When the data read in the sense amplifier S/A is not equal to the set data received from the input/output line I/O, the comparing unit 100 activates the write control signal W_C. When the write control signal W_C is activated, the write voltage Vreset, having a second operating condition, is applied to the selected unit phase change resistance cell C to write a reset data.

The sense amplifier S/A reads data of the unit phase change resistance cell C (step S19). The comparing unit 100 compares the data read in the sense amplifier S/A with the write data received from the input/output line I/O (step S20).

When the read data is equal to the write data, the write cycle is finished. When the read data is not equal to the write data after n repetitions of the write operation, the unit phase change resistance cell C is repaired using a redundancy cell thereby completing the write cycle (step S21).

As a result, a plurality of reset write operating conditions are changed to writing and verify a reset data, thereby obtaining a reset write operating condition suitable for a characteristic of each unit phase change resistance cell C.

Figure 12:
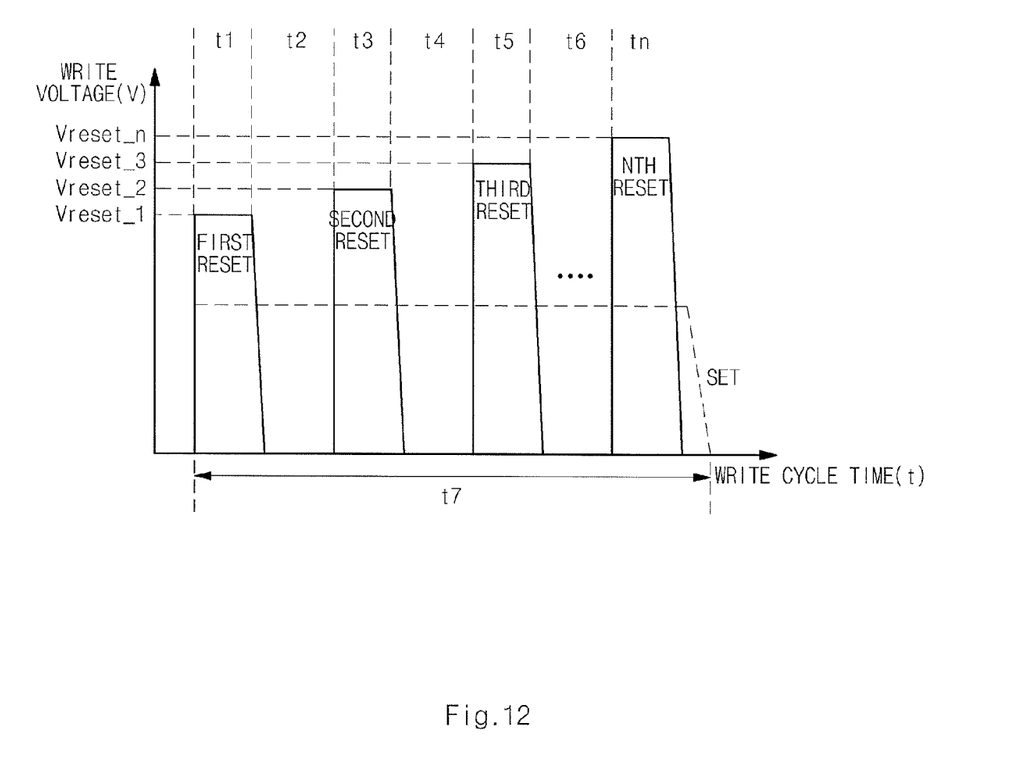
FIG. 12 is a timing diagram showing a write cycle operation of a phase change memory device according to an embodiment of the present invention.

FIG. 12 is a timing diagram showing a write cycle operation of a phase change memory device according to an embodiment of the present invention.

In the period t1, a write voltage Vreset_1 having the first operating condition is applied to the unit phase change memory cell C through the write driving unit W/D.

In a period t2, the comparing unit 100 reads the data stored in the phase change memory cell C. The comparing operation is performed to verify whether the reset data is normally written in the unit phase change resistance cell C by the write voltage Vreset_1. When the read data is equal to the set data, the write cycle is finished. When the read data is different not equal to the set data, the period t3 begins.

In the period t3, a first write voltage Vreset_2 having the second operating condition is applied to the unit phase change memory cell C through the write driving unit W/D.

In a period t4, the comparing unit 100 reads the data stored in the phase change memory cell C to compare the read data with the reset data. The comparing operation is performed to verify whether the reset data is normally written in the unit phase change resistance cell C by the write voltage Vreset_2. When the read data is equal to the set data, the write cycle is finished. When the read data is not equal to the set data, a period t5 starts.

The nth operating condition is varied to write and verify a reset data, thereby obtaining an operating condition corresponding to a characteristic of each unit phase change resistance cell C.

A write voltage Vreset_n is larger than a write voltage Vreset_3 which is larger than a write voltage Vreset_2. The write voltage Vreset_2 is larger than a write voltage Vreset_1. That is, the levels of the write voltages increase sequentially.

According to an embodiment of the present invention, the reset condition in a reset data write cycle includes a plurality of short pulse times. Between reset pulse receiving times there is a period of comparing and verifying a written data with the reset data.

Each write voltage Vreset_1 to write voltage Vreset_n is applied for the same reset voltage receiving time, and the level of the reset pulse voltage is sequentially increased from the write voltage Vreset_1 to the write voltage Vreset_n.

When a data fail is generated in the first reset write operation, the write voltage Vreset is increased one step and a second reset write operation is performed. Each time a data fail occurs the write voltage Vreset_n is increased up to an nth step, so that the reset data may be normally written in failed cells.

A plurality of reset pulses may be applied during the time for receiving a set pulse (time t7). As a result, according to an embodiment of the present invention the reset data can be normally written in all phase change resistance cells C during a write cycle time that is the same as that of a conventional art.

Figure 13:
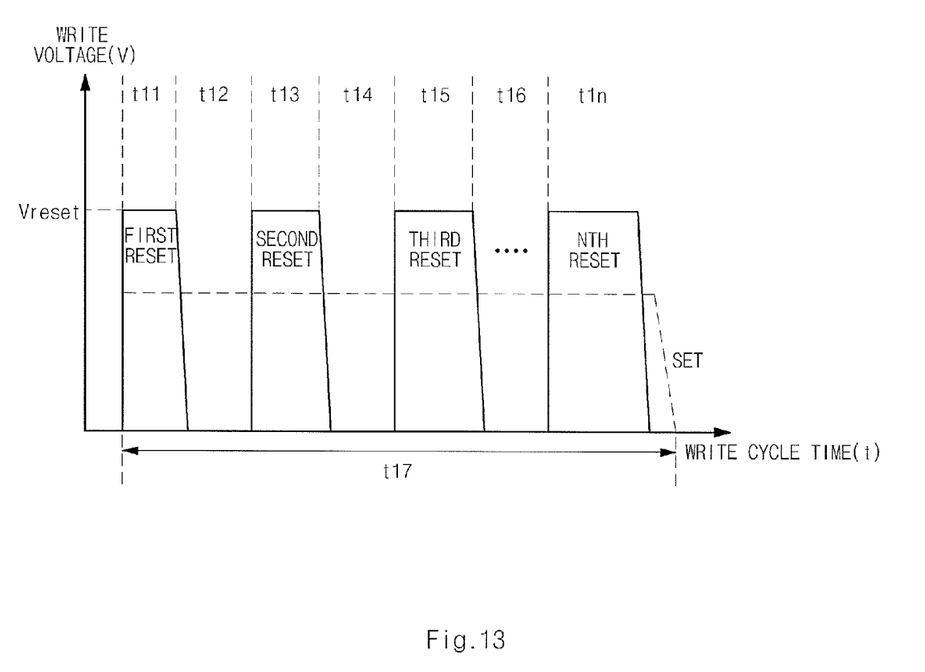
FIG. 13 is a timing diagram showing a write cycle operation of a phase change memory device according to an embodiment of the present invention.

FIG. 13 is a timing diagram showing a write cycle operation of a phase change memory device according to an embodiment of the present invention.

A write voltage Vreset is applied to the unit phase change memory cell C through the write driving unit W/D during a first write time t11.

In a period t12, data of the unit phase change resistance cell C is read through the sense amplifier S/A. The comparing unit 100 compares the read data with the reset data. The comparing operation is performed to verify whether the reset data is normally written in the unit phase change resistance cell C by the write voltage Vreset during the first write time t11.

When the read data is equal to the reset data, the write cycle is finished. When the read data is not equal to the reset data, the write voltage Vreset is applied to the phase change resistance cell C selected through the write driving unit W/D during a second write time t13.

In a period t14, the data stored in the phase change memory cell C is read through the sense amplifier S/A. The comparing unit 100 compares the read data with the reset data. The comparing operation is performed to verify whether the reset data is normally written in the unit phase change resistance cell C by the write voltage Vreset during the second write time t13.

When the read data is equal to the set data, the write cycle is finished. When the read data is not equal to the set data, the write voltage Vreset is applied to the selected phase change resistance cell C selected through the write driving unit W/D during the third write time t15.

The nth operating time is varied to write and verify a reset data, thereby obtaining an operating condition corresponding to a characteristic of each unit phase change resistance cell C.

A write time t1n is longer than the write time t15, which is longer than the write time t13. The write time t13 is longer than the write time t11. That is each write time t11-tn is longer than the preceding write time.

According to an embodiment of the present invention, the reset condition in a reset data write cycle includes a plurality of short pulse times. Between reset pulse receiving times there is a period of comparing and verifying the written data with the reset data.

According to an embodiment of the present invention, the same reset voltage receiving time is applied, and the write voltage Vreset receiving time is sequentially increased from the write time t11 to the write time t1n.

When a data fail is generated in the first reset write operation, the write time t is increased one step and a second reset write operation is performed. Each time a data fail occurs the write time t is increased up to an nth step, so that the reset data may be normally written in failed cells.

A plurality of reset pulses may be applied during the time for receiving a set pulse (t17). As a result, according to an embodiment of the present invention, the reset data can be normally written in all phase change resistance cells during a write cycle time that is the same as that of a conventional art.

Figure 14:
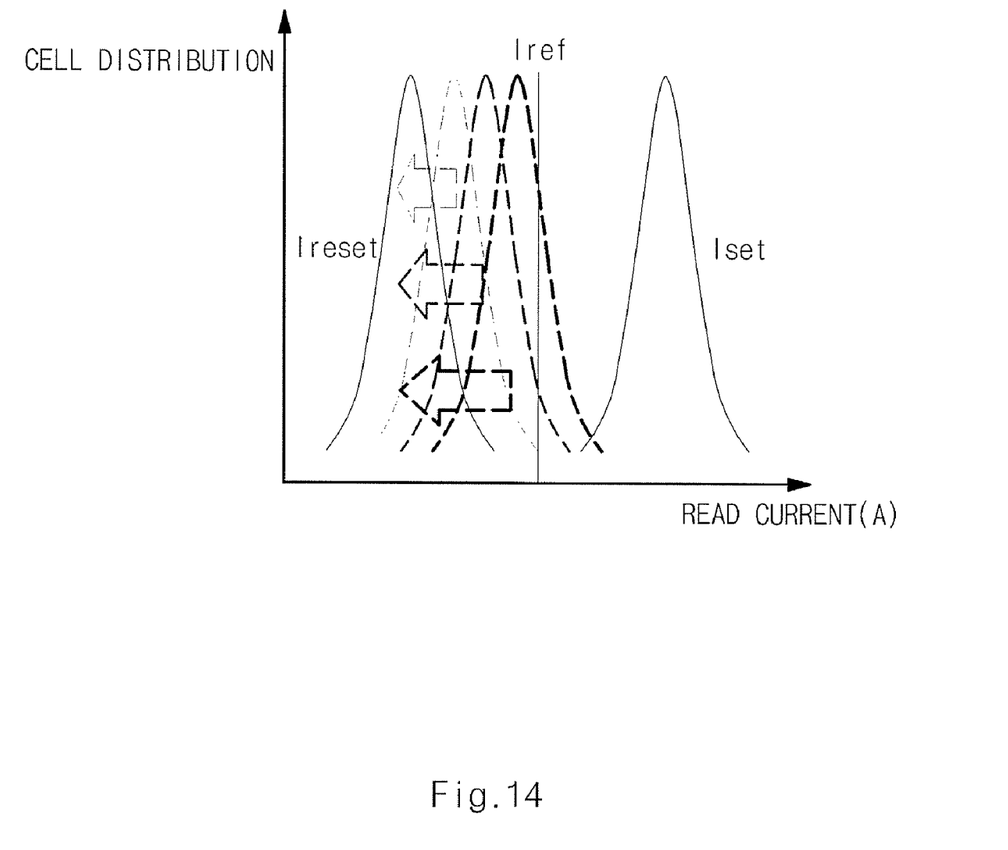
FIG. 14 is a diagram showing a read current relation of a phase change memory device according to an embodiment of the present invention.

FIG. 14 is a diagram showing the read current relationship of a phase change memory device according to an embodiment of the present invention.

When a write cycle starts, an operating condition for writing a reset data is changed several times by repeating writing and verifying operations. That is, if a fail of the read currents is generated based on the reference current Iref, the value of the reset current Ireset is varied and the write and read operations are performed until the reset data is written.

Even when a characteristic of each phase change resistance cell C is different, the operating condition corresponding to each characteristic is changed so as to write the reset data normally.

As described above, a phase change memory device according to an embodiment of the present invention performs a writing operation by determining whether a data stored in a phase change resistance cell is equal to new data to be written in a write mode of a phase change memory device. As such, the number of unnecessary write operations may be reduced.

The phase change memory device according to an embodiment of the present invention writes data normally in each unit phase change resistance cells of a cell array under an operating condition suitable for a characteristic of each unit phase change resistance cell in a write mode of a phase change memory device.

The phase change memory device according to an embodiment of the present invention drives a stable reset write state in a phase change memory device improving reliability of cells and the margin of read sensing currents.

Therefore, when initial characteristics of the unit phase change resistance cells C vary, the embodiments of the present invention allow the reset data to be normally written by changing the operating conditions corresponding to the initial characteristics.

Although a number of illustrative embodiments consistent with the invention have been described, it should be understood that numerous other modifications and embodiments can be devised by those skilled in the art that will fall within the spirit and scope of the present invention. More particularly, a number of variations and modifications are possible in the component parts and/or arrangements that are within the scope of the disclosure, the drawings, and the accompanying claims. In addition to variations and modifications in the component parts and/or arrangements, alternative uses will also be apparent to those skilled in the art.

What is claimed is:

1. A phase change memory device comprising:
a cell array unit including a phase change resistance cell positioned at an intersection of a word line and a bit line; and
a write driving unit selectively supplying a write voltage corresponding to a data to be written,
wherein the write driving unit generates a single write voltage when the data to be written is a first data and the write driving unit generates a plurality of write voltages when the data to be written is a second data,
wherein the write driving unit generates each write voltage of the plurality of write voltages to have a different voltage level and a same write time.

2. A phase change memory device comprising:
a cell array unit including a phase change resistance cell positioned at an intersection of a word line and a bit line; and
a write driving unit selectively supplying a write voltage corresponding to a data to be written,
wherein the write driving unit generates a single write voltage when the data to be written is a first data and the write driving unit generates a plurality of write voltages when the data to be written is a second data,
wherein the write driving unit generates each write voltage of the plurality of write voltages to have a same voltage level and a different write time.

3. The phase change memory device according to claim 1, wherein the phase change resistance cell comprises:
a phase change resistor storing a data corresponding to a resistance change by sensing a crystallization state, wherein the crystallization state is varied according to currents; and
a diode element connected between the phase change resistor and the word line.

4. The phase change memory device according to claim 1, wherein the first data is a set data.

5. The phase change memory device according to claim 1, wherein the second data is a reset data.

6. An operating method of a phase change memory device comprising a phase change resistance cell storing a data corresponding to resistance change by sensing a crystallization state varied according to currents, the method comprising:
reading a data of the phase change resistance cell selected in a write mode;
comparing a data to be written with the data read in the phase change resistance cell to judge;
determining whether the data to be written is a first data when the read data is not equal to the data to be written; and
writing and verifying the first data in the phase change resistance cell by changing a write operating condition when the data to be written is the first data.

7. The operating method according to claim 6, further comprising performing a preheating operation on the phase change resistance cell when the read data is not equal to the data to be written.

8. The operating method according to claim 7, wherein the preheating operation is performed by applying a current having a triangular pulse shape to the phase change resistance cell for a given time.

9. The operating method according to claim 6, wherein the verifying process is performed repeatedly until the read data is equal to the first data.

10. The operating method according to claim 9, wherein the writing and verifying the first data step comprises adjusting each write voltage of a plurality of write voltages to be at a different level during a same write time when the read data is not equal to the first data.

11. The operating method according to claim 10, wherein the write voltages are increased sequentially.

12. The operating method according to claim 9, wherein the writing and verifying the first data step includes adjusting each write voltage of a plurality of write voltages to be at a different write time with a same write voltage when the read data is different from the first data.

13. The operating method according to claim 12, wherein the write time is increased sequentially.

14. The operating method according to claim 6, wherein the first data is a reset data.

15. The operating method according to claim 6, further comprising writing a second data in the phase change resistance cell when the data to be written is not the first data.

16. The operating method according to claim 15, wherein the second data is a set data.

17. The operating method according to claim 6, wherein the verifying process comprises:
reading a cell data stored in the phase change resistance cell; and
comparing the cell data with the first data.

18. The operating method according to claim 17, wherein the writing the first data, the reading the cell data, and the comparing the data are performed repeatedly.

19. The operating method according to claim 6, further comprising stopping the writing process when the read data is equal to the data to be written.

20. The operating method according to claim 19, further comprising finishing the writing process and performing a redundancy operation when the first data is different from an nth cell data.

* * * * *